US012027448B2

(12) United States Patent
Karhade et al.

(10) Patent No.: US 12,027,448 B2
(45) Date of Patent: Jul. 2, 2024

(54) OPEN CAVITY BRIDGE POWER DELIVERY ARCHITECTURES AND PROCESSES

(71) Applicant: Intel Coporation, Santa Clara, CA (US)

(72) Inventors: Omkar Karhade, Chandler, AZ (US); Mitul Modi, Phoenix, AZ (US); Sairam Agraharam, Chandler, AZ (US); Nitin Deshpande, Chandler, AZ (US); Digvijay Raorane, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 951 days.

(21) Appl. No.: 16/828,428

(22) Filed: Mar. 24, 2020

(65) Prior Publication Data

US 2021/0305133 A1 Sep. 30, 2021

(51) Int. Cl.

| | |
|---|---|
| ***H01L 23/482*** | (2006.01) |
| ***H01L 23/485*** | (2006.01) |
| ***H01L 23/495*** | (2006.01) |
| ***H01L 23/538*** | (2006.01) |

(52) U.S. Cl.

CPC ...... *H01L 23/4821* (2013.01); *H01L 23/4825* (2013.01); *H01L 23/485* (2013.01); *H01L 23/49503* (2013.01); *H01L 23/5381* (2013.01)

(58) Field of Classification Search

CPC ............... H01L 23/482; H01L 23/4821; H01L 23/4825; H01L 23/485; H01L 23/49503; H01L 23/5381

See application file for complete search history.

(56) References Cited

U.S. PATENT DOCUMENTS

| | | | | |
|---|---|---|---|---|
| 9,443,824 | B1* | 9/2016 | We | H01L 25/0655 |
| 2012/0261838 | A1* | 10/2012 | Braunisch | H01L 25/0655 257/E21.511 |
| 2014/0117552 | A1* | 5/2014 | Qian | H01L 23/5383 257/E23.141 |

(Continued)

FOREIGN PATENT DOCUMENTS

| | | | | |
|---|---|---|---|---|
| CN | 109979917 A * | 7/2019 | | H01L 23/49838 |
| DE | 112015007283 B3 * | 3/2022 | | H01L 21/4853 |

(Continued)

*Primary Examiner* — Matthew E Warren

(74) *Attorney, Agent, or Firm* — Schwabe, Williamson & Wyatt, P.C.

(57) ABSTRACT

Embodiments disclosed herein include multi-die packages with open cavity bridges. In an example, an electronic apparatus includes a package substrate having alternating metallization layers and dielectric layers. The package substrate includes a first plurality of substrate pads and a second plurality of substrate pads, and an open cavity. A bridge die is in the open cavity, the bridge die including a first plurality of bridge pads, a second plurality of bridge pads, a power delivery bridge pad between the first plurality of bridge pads and the second plurality of bridge pads, and conductive traces. A first die is coupled to the first plurality of substrate pads and the first plurality of bridge pads. A second die is coupled to the second plurality of substrate pads and the second plurality of bridge pads. A power delivery conductive line is coupled to the power delivery bridge pad.

11 Claims, 11 Drawing Sheets

(56) References Cited

U.S. PATENT DOCUMENTS

2020/0098692 A1* 3/2020 Liff ..................... H01L 23/5386
2021/0098375 A1* 4/2021 Foo ................... H01L 21/76877
2021/0134724 A1* 5/2021 Rubin ................. H01L 23/5385
2021/0193577 A1* 6/2021 Lin ..................... H01L 21/6835
2021/0202440 A1* 7/2021 Chang Chien ...... H01L 23/5381

FOREIGN PATENT DOCUMENTS

WO WO-2017111957 A1 * 6/2017 ......... H01L 21/4853
WO WO-2019132965 A1 * 7/2019 ....... H01L 23/49822
WO WO-2019161641 A1 * 8/2019 ......... H01L 21/4853

* cited by examiner 760
702
710
712
714
716
717
720
722
724
730
732
734
758
704
706

770
702
704
706
710
712
714
716
717
720
722
724
730
732
734
778

OPEN CAVITY BRIDGE POWER DELIVERY ARCHITECTURES AND PROCESSES

TECHNICAL FIELD

Embodiments of the present disclosure relate to semiconductor devices, and more particularly to a multi-die package with an open cavity bridge.

BACKGROUND

The demand for miniaturization of form factor and increased levels of integration for high performance are driving sophisticated packaging approaches in the semiconductor industry. One such approach is to use die partitioning to enable miniaturization of small form factor and high performance. Such architectures depend on fine die-to-die interconnects to couple the partitioned dies together. Embedded multi-die interconnect bridges (EMIBs) have been used to provide the fine die-to-die interconnects. However, EMIBs also have their own integration challenges.

One challenge is that EMIBs suffer from a high cumulative bump thickness variation (BTV). BTV is becoming an even greater engineering hurdle as more EMIBs are included in a package and as the sizes of the EMIBs increase. Placing the EMIBs onto a glass patch has been proposed to reduce the BTV and improve warpage. However, the glass patch is a thick substrate that has low thermal conductivity. Accordingly, thermocompression bonding (TCB) is not suitable for the mid-level interconnects (MLIs). Accordingly, the pitch of the MLIs needs to be increased in order to accommodate alternative bonding techniques, such as traditional chip attach module (mass reflow) process. Increasing the pitch of the MLIs requires the use of one or more redistribution layers disposed over the glass patch. The redistribution layers negate the BTV benefits provided by the glass, and is not a desirable solution.

EMBODIMENTS OF THE PRESENT DISCLOSURE

Figure 1:
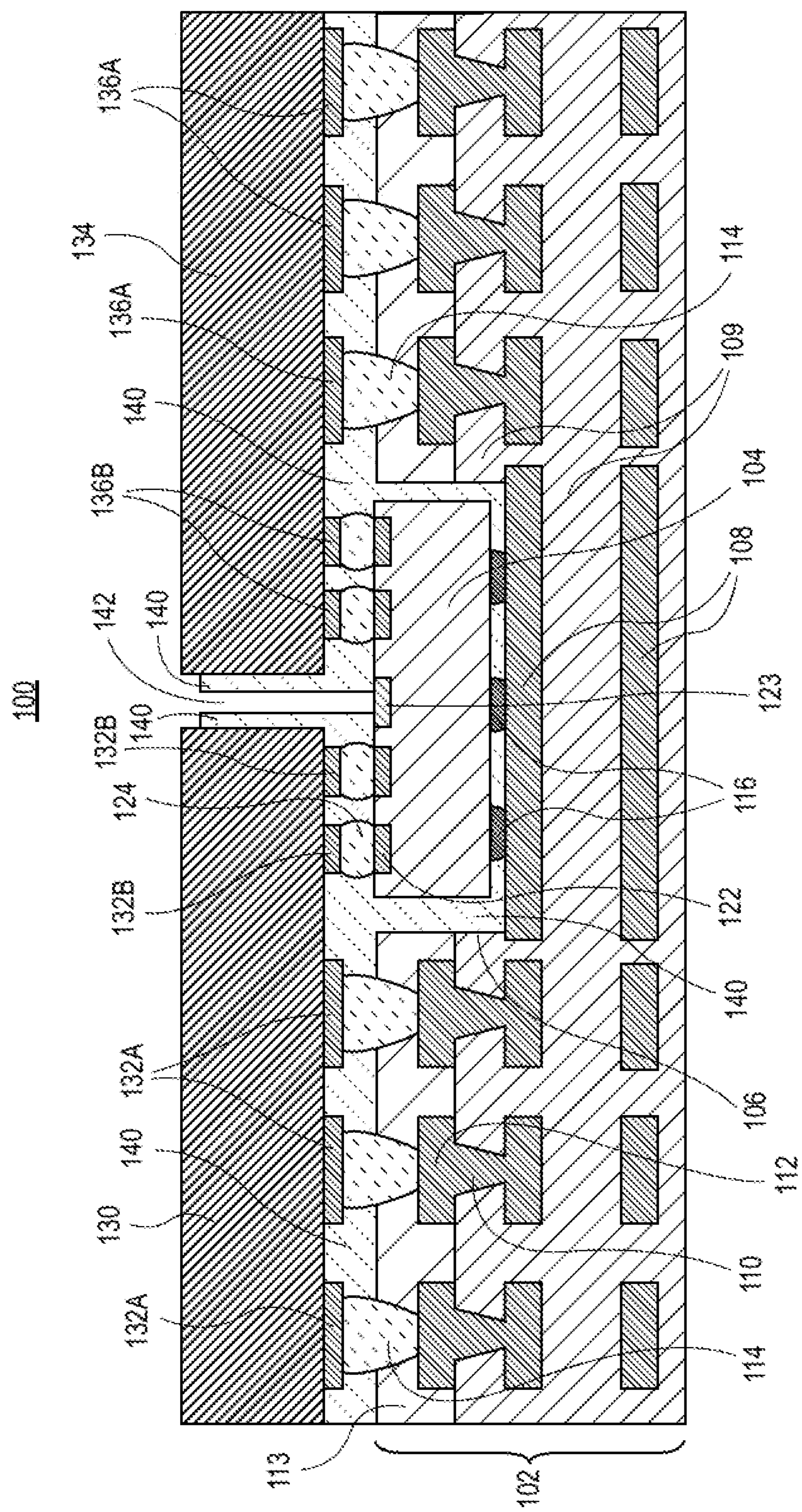
FIGS. 1 and 2 are cross-sectional illustrations representing various operations in a method of fabricating an electronic package with an open cavity bridge, in accordance with an embodiment of the present disclosure.

Described herein are multi-die packages with open cavity bridges, in accordance with various embodiments. In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as “upper”, “lower”, “above”, and “below” refer to directions in the drawings to which reference is made. Terms such as “front”, “back”, “rear”, and “side” describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, partitioned die architectures are limited, at least in part, by the interconnect architectures used to couple the partitioned dies together. For example, the use of embedded multi-die interconnect bridge (EMIB) architectures is limited by bump thickness variation (BTV) considerations. Attempts to improve BTV in EMIB architectures by using a glass patch have been unsuccessful to date. Particularly, the glass patch requires the use of mass reflow techniques for mid-level interconnects (MLIs). Since mass reflow requires larger bump pitches, a redistribution layer (RDL) must be added to the glass patch to accommodate the pitch translation. The RDL negatively impacts thickness uniformity, negating the benefits of using a glass patch.

Accordingly, embodiments disclosed herein include an electronic package that includes an open cavity bridge. An open cavity bridge can include passive interconnections and, possibly, may include active regions with transistors or the like.

One or more embodiments describes herein are directed to open cavity bridge power delivery solutions. Open cavity bridge architectures described herein may be suitable for connected multiple die while offering lower cost, high bandwidth solutions. In an example, as compared to an embedded bridge architecture, an open cavity bridge typically does not have surface routing on top of the bridge. Embodiments described herein can be implemented to address such issues.

To provide context, previous solutions have included (a) enabling power routing with routing inside a die (which may cause high resistance due to thin traces inside silicon), (b) wire bond solutions, or (c) through silicon via (TSV) solutions to connect a bridge die to package substrate routing.

In accordance with embodiments described herein, several power delivery architectures are disclosed herein, including (1) power delivery through a mold/underfill trench filled with a conductive material, (2) power delivery through a soldered/electrically connected long wire or component connecting a bridge to package substrate routing, and (3) a bridge with exposed sides connecting electrically to the substrate cavity for power delivery. Advantages to implementing embodiments described herein can include (1) the delivery of power to the top dies (e.g., to the bridge-coupled logic/memory dies) without relying on top die in-silicon routing, and/or (2) enabling larger bridge dies with deep connectivity and power delivery.

Figure 2:
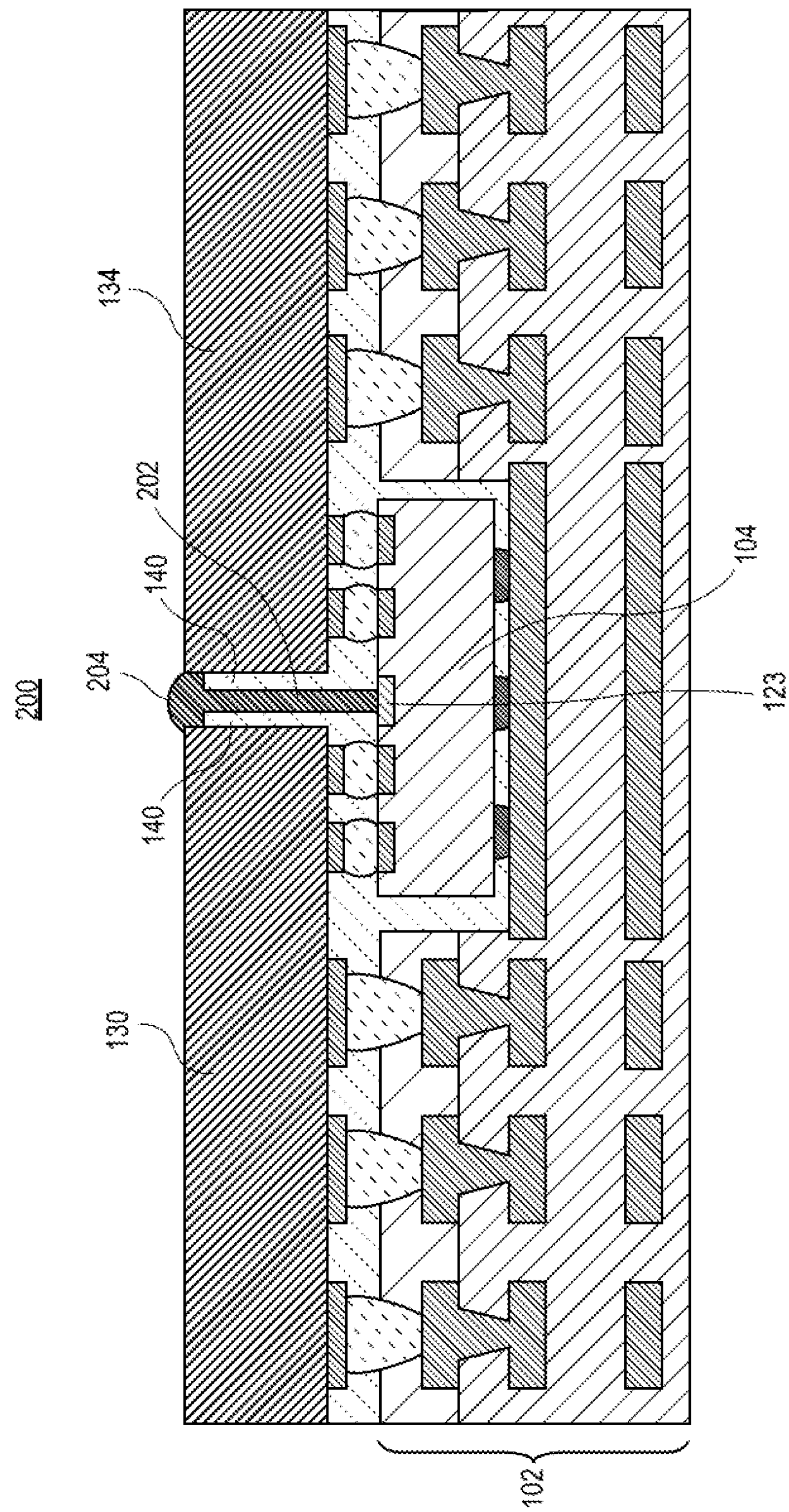
Figure 3:
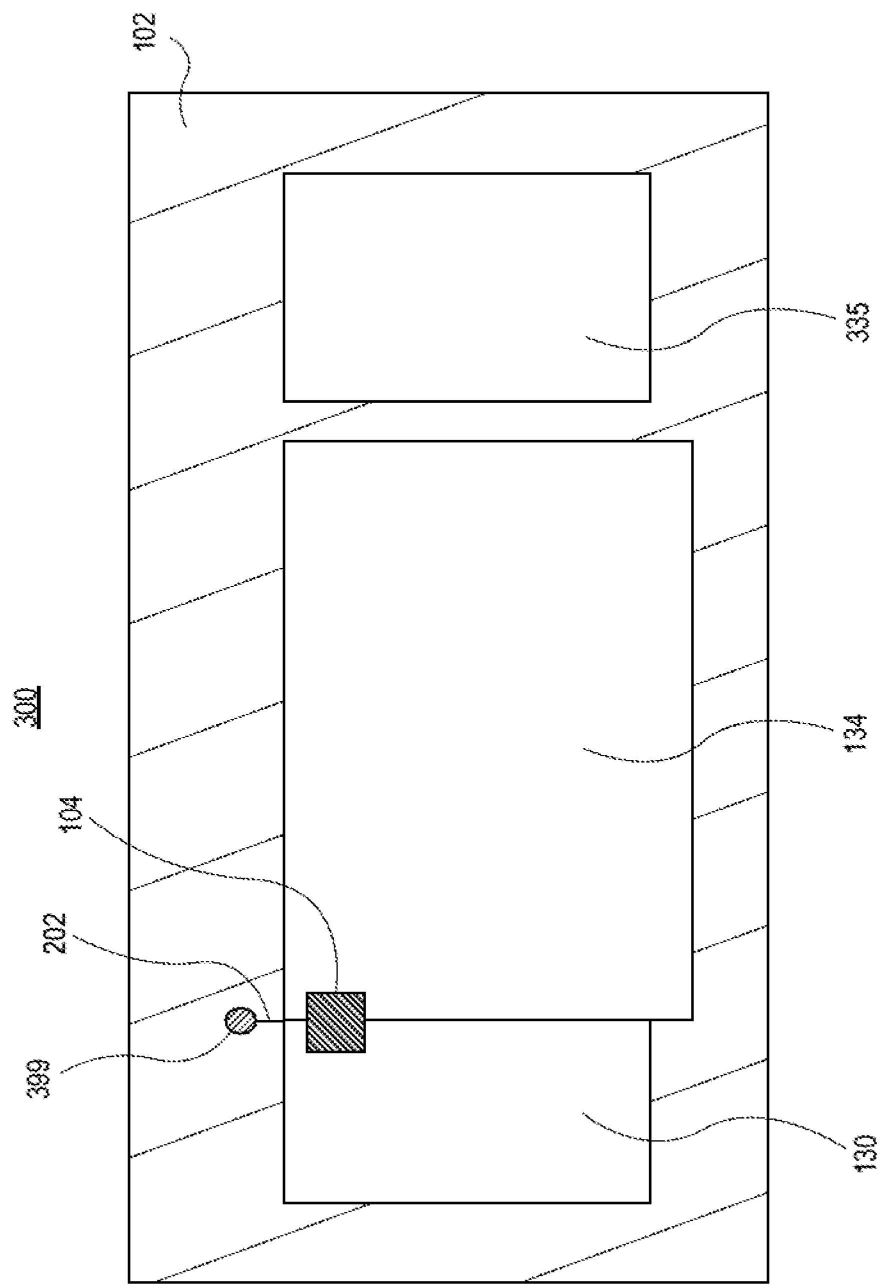
FIG. 3 is a plan view illustration of an exemplary layout for the electronic package of FIG. 2, in accordance with another embodiment of the present disclosure.

In a first aspect, a laser trench is used to provide a power delivery location for an open cavity bridge architecture. For example, a laser-formed trench is formed in a location between logic dies over a bridge. A laser trench can be formed in an underfill material between die or in a mold between dies. The trench is formed to expose a bridge pad or bump. The trench can then be filled with a printed conductive adhesive (e.g., copper or silver filled) or solder. The trench can be "drawn" to a location outside a die footprint with a via to a substrate top where power is sourced through the substrate. As an example, FIGS. 1 and 2 are cross-sectional illustrations representing various operations in a method of fabricating an electronic package with an open cavity bridge, in accordance with an embodiment of the present disclosure. FIG. 3 is a plan view illustration of an exemplary layout for the electronic package of FIG. 2, in accordance with another embodiment of the present disclosure.

Referring to FIG. 1, an intermediate electronic apparatus 100 includes a package substrate 102 having alternating metallization layers 108 and dielectric layers 109. The package substrate 102 also includes a first plurality of substrate pads (left 112*s*) and a second plurality of substrate pads (right 112*s*), which may be coupled to the metallization layers 108 by conductive vias 110. An open cavity 106 is between the first plurality of substrate pads (left 112*s*) and the second plurality of substrate pads (right 112*s*). The open cavity 106 has a bottom and sides. A bridge die 104 is in the open cavity 106. The bridge die 104 includes a first plurality of bridge pads (left 122*s*), a second plurality of bridge pads (right 122*s*), a power delivery bridge pad 123 between the first plurality of bridge pads (left 122*s*) and the second plurality of bridge pads (right 122*s*), and conductive traces (not depicted). Solder structures 114 are coupled to the substrate pads 112, and may include a solder resist 113 there between. Solder structures 124 are coupled to the bridge pads 122. A first die 130 is coupled to the solder structures 114 on the first plurality of substrate pads (left 112*s*) and to the solder structures 124 on the first plurality of bridge pads (left 122*s*), e.g., by first die pads 132A and 132B, respectively. A second die 134 is coupled to the solder structures 114 on the second plurality of substrate pads (right 112*s*) and to the solder structures 124 on the second plurality of bridge pads (right 122*s*), e.g., by second die pads 136A and 136B, respectively. The second die 134 is coupled to the first die 130 by the conductive traces of the bridge die 104.

In an embodiment, intermediate electronic apparatus 100, further includes an underfill material 140 between the first die 130 and the package substrate 102, between the first die 130 and the bridge die 104, between the second die 134 and the package substrate 102, between the second die 134 and the bridge die 104, and in the open cavity 106. In an embodiment, a trench 142 is formed in the underfill material 140 between the first die 130 and the second die 134. In one embodiment, trench 142 is formed using a laser ablation or laser scribe process.

In an embodiment, epoxy dots 116 coupled bridge die 104 to the bottom of the open cavity 106 of package substrate 102. In one such embodiment, epoxy dots 116 are coupled to an exposed metallization layer 108 of package substrate 102, as is depicted. In other embodiments, epoxy dots 116 are coupled to a dielectric layer 109 of package substrate 102. In another embodiment, an adhesive layer couples the bridge die 104 to the bottom of the open cavity 106, exemplary structures for which are described below in association with FIGS. 7A-7C. In yet another embodiment, solder structures couple the bridge die 104 to the bottom of the open cavity 106, an exemplary structure for which is described below in association with FIG. 7D. In one such embodiment, the bottom of the open cavity 106 has an exposed metal layer (e.g. one of metallization layers 108), the bridge die 104 has a first side including the first plurality of bridge pads (left 122*s*), the second plurality of bridge pads (right 122*s*), the power delivery bridge pad 123, and the conductive traces. The bridge die 104 has a second side including a metallization layer, and the solder structures are in contact with the metallization layer of the bridge die 104 and in contact with the exposed metal layer of the bottom of the open cavity 106.

In an embodiment, adjacent pads of the first plurality of bridge pads (left 122*s*) and adjacent pads of the second plurality of bridge pads (right 122*s*) have a first pitch, and adjacent pads of the first plurality of substrate pads (left 112*s*) and adjacent pads of the second plurality of substrate pads (right 112*s*) have a second pitch greater than the first pitch. In one embodiment, the first pitch is less than approximately 100 μm and the second pitch is greater than approximately 100 μm.

Referring to FIG. 2, an electronic apparatus 200 includes a power delivery conductive line 202 that is formed coupled to the power delivery bridge pad 123. In one embodiment, the power delivery conductive line 202 is in the trench 142 in underfill material 140, as is depicted. In on such embodiment, the power delivery conductive line 202 further includes a cap portion 204 formed over the underfill material 140, as is depicted. In one embodiment, the power delivery conductive line 202 (and possibly including portion 204) is or includes a conductive adhesive or solder. In an embodiment, the electronic apparatus 200 includes a board coupled to a side of the package substrate opposite the first die and the second die, exemplary structures of which are described in association with FIGS. 7A-7D.

Referring to FIG. 3, in an exemplary electronic apparatus 300, package substrate 102 further includes a substrate pad 399 outside of a footprint of the first die 130 and the second die 134. The power delivery conductive line 202 is coupled to the substrate pad 399 outside of the footprint of the first die 130 and the second die 134. In the particular arrangement shown, electronic apparatus 300 can include other features such as a passive component 335.

In a second aspect, a power delivery structure for an open cavity bridge architecture includes additional solder bumps placed between dies on the bridge die, as well as on the package substrate. A long rigid conductor, such as a long metal sheet or wire can be placed on top of the bumps and reflowed. Such a long rigid conductor can instead be attached using a conductive adhesive. The long rigid conductor may be smaller than the die to die spacing in width (e.g., less than approximately 100 microns). Multiple such long rigid conductors can be attached to carry power and ground. IC dies, such as a CPU and GPU, may then be attached on top of the substrate and embedded in an underfill material. As an example, FIGS. 4 and 5 are a cross-sectional illustration and a plan view illustration, respectively, of another electronic package with an open cavity bridge, in accordance with another embodiment of the present disclosure.

Figure 4:
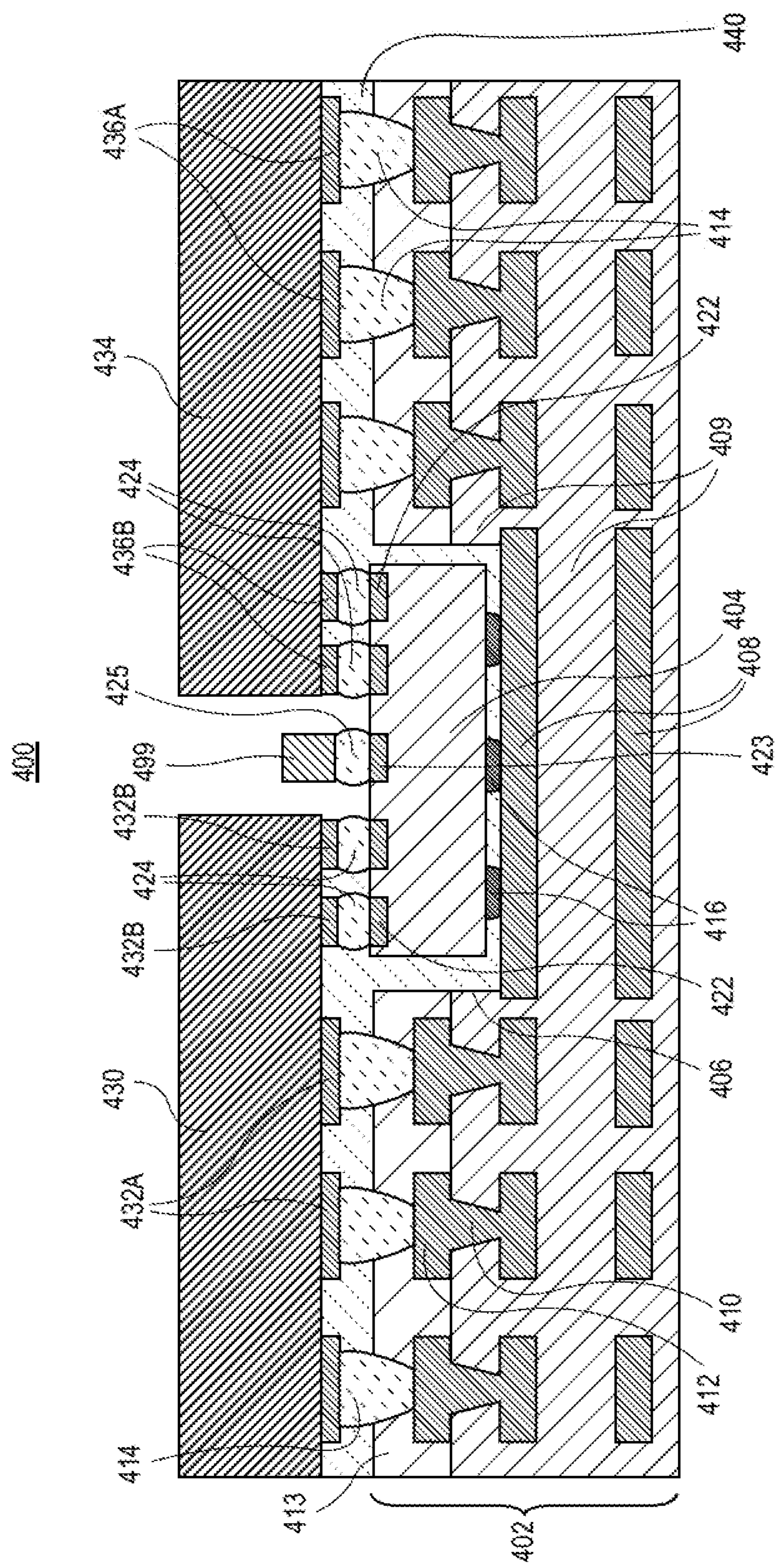
FIGS. 4 and 5 are a cross-sectional illustration and a plan view illustration, respectively, of another electronic package with an open cavity bridge, in accordance with another embodiment of the present disclosure.
Figure 5:
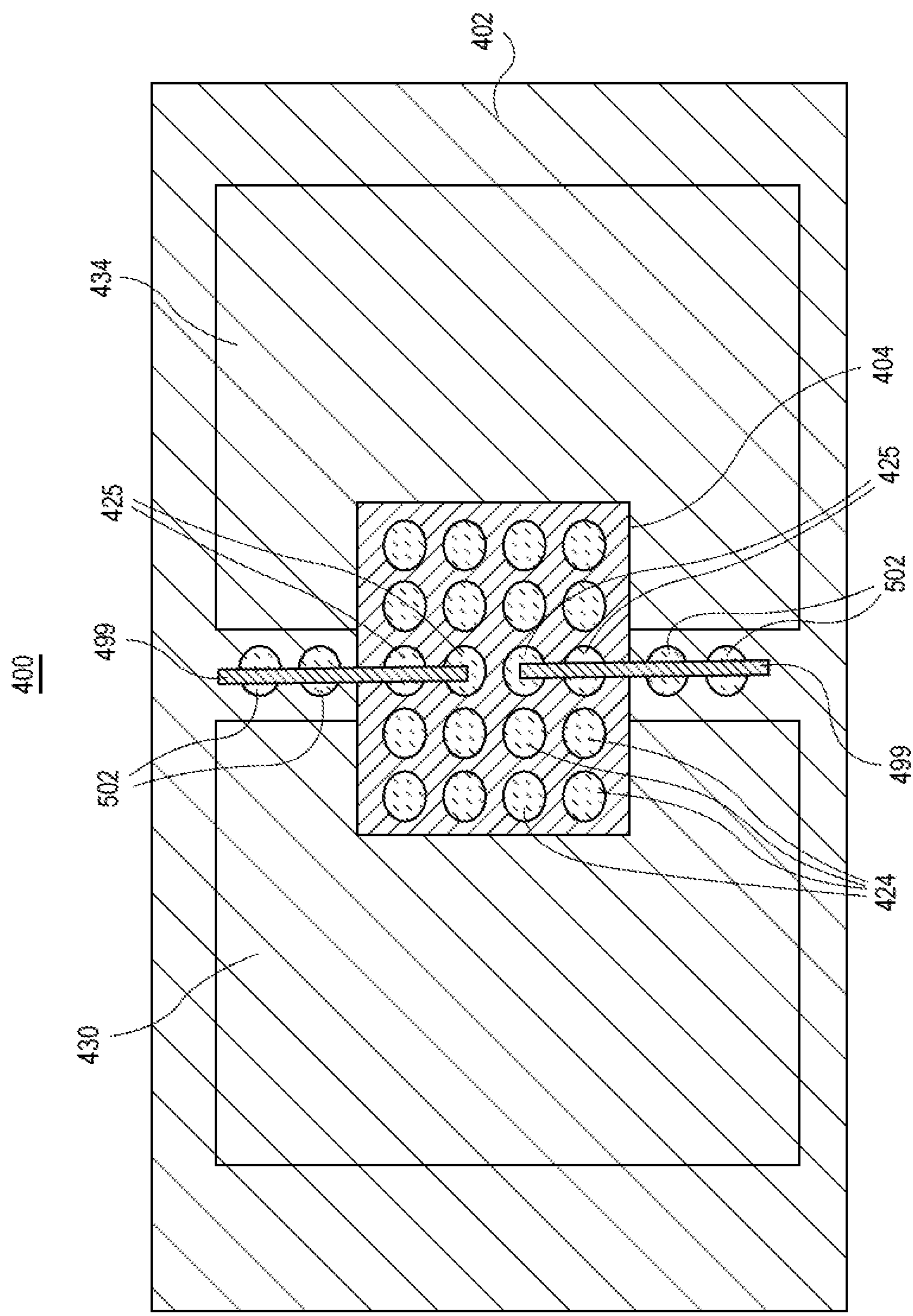

Referring to FIG. 4, an electronic apparatus 400 includes a package substrate 402 having alternating metallization layers 408 and dielectric layers 409. The package substrate 402 also includes a first plurality of substrate pads (left 412*s*) and a second plurality of substrate pads (right 412*s*), which may be coupled to the metallization layers 408 by conductive vias 410. An open cavity 406 is between the first plurality of substrate pads (left 412*s*) and the second plurality of substrate pads (right 412*s*). The open cavity 406 has a bottom and sides. A bridge die 404 is in the open cavity 406. The bridge die 404 includes a first plurality of bridge pads (left 422*s*), a second plurality of bridge pads (right 422*s*), one or more power delivery bridge pads 423 between the first plurality of bridge pads (left 422*s*) and the second plurality of bridge pads (right 422*s*), and conductive traces (not depicted). Solder structures 414 are coupled to the substrate pads 412, and may include a solder resist 413 there between. Solder structures 424 are coupled to the bridge pads 422. A first die 430 is coupled to the solder structures 414 on the first plurality of substrate pads (left 412*s*) and to the solder structures 424 on the first plurality of bridge pads (left 422*s*), e.g., by first die pads 432A and 432B, respectively. A second die 434 is coupled to the solder structures 414 on the second plurality of substrate pads (right 412*s*) and to the solder structures 424 on the second plurality of bridge pads (right 422*s*), e.g., by second die pads 436A and 436B, respectively. The second die 434 is coupled to the first die 430 by the conductive traces of the bridge die 404.

In an embodiment, electronic apparatus 400, further includes an underfill material 440 between the first die 430 and the package substrate 402, between the first die 430 and the bridge die 404, between the second die 434 and the package substrate 402, between the second die 434 and the bridge die 404, and in the open cavity 406. In an embodiment, the underfill material 440 is not laterally between the first die 430 and the second die 434.

In an embodiment, epoxy dots 416 coupled bridge die 404 to the bottom of the open cavity 406 of package substrate 402. In one such embodiment, epoxy dots 416 are coupled to an exposed metallization layer 408 of package substrate 402, as is depicted. In other embodiments, epoxy dots 416 are coupled to a dielectric layer 409 of package substrate 402. In another embodiment, an adhesive layer couples the bridge die 404 to the bottom of the open cavity 406, exemplary structures for which are described below in association with FIGS. 7A-7C. In yet another embodiment, solder structures couple the bridge die 404 to the bottom of the open cavity 406, an exemplary structure for which is described below in association with FIG. 7D. In one such embodiment, the bottom of the open cavity 406 has an exposed metal layer (e.g. one of metallization layers 408), the bridge die 404 has a first side including the first plurality of bridge pads (left 422*s*), the second plurality of bridge pads (right 422*s*), the power delivery bridge pads 423, and the conductive traces. The bridge die 404 has a second side including a metallization layer, and the solder structures are in contact with the metallization layer of the bridge die 404 and in contact with the exposed metal layer of the bottom of the open cavity 406.

In an embodiment, adjacent pads of the first plurality of bridge pads (left 422*s*) and adjacent pads of the second plurality of bridge pads (right 422*s*) have a first pitch, and adjacent pads of the first plurality of substrate pads (left 412*s*) and adjacent pads of the second plurality of substrate pads (right 412*s*) have a second pitch greater than the first pitch. In one embodiment, the first pitch is less than approximately 100 μm and the second pitch is greater than approximately 100 μm. In an embodiment, the electronic apparatus 400 includes a board coupled to a side of the package substrate opposite the first die and the second die, exemplary structures of which are described in association with FIGS. 7A-7D.

Referring to FIGS. 4 and 5, in an embodiment, a plurality of bridge solder structures 425 is coupled to corresponding ones of the plurality of power delivery bridge pads 423. A power delivery conductive line 499 is coupled to the plurality of solder structures 425. The package substrate 402 further includes a plurality of substrate pads between the first die 430 and the second die 434. A plurality of substrate solder structures 502 is coupled to corresponding ones of the plurality of substrate pads. The power delivery conductive line 499 is coupled to the plurality of substrate solder structures 502. In one embodiment, more than one power delivery conductive line 499 is included in electronic apparatus 400.

In a third aspect, power delivery for a bridge die is provided as a silicon side power delivery. A bridge die is singulated in die prep with a power routing exposed on a silicon side wall. In substrate manufacturing, a substrate cavity is created with exposed copper power traces/plane exposed on the side wall. A router/milling approach can be used to cut through copper on side walls. Post process cleaning of smear through chemical or mechanical processes can be performed in a die cavity assembly. Conductive paste or jetted solder may then be dispensed in the cavity to electrically "bridge" the substrate and die power planes. As an example, FIG. 6 is a cross-sectional illustration of another electronic package with an open cavity bridge, in accordance with another embodiment of the present disclosure.

Figure 6:
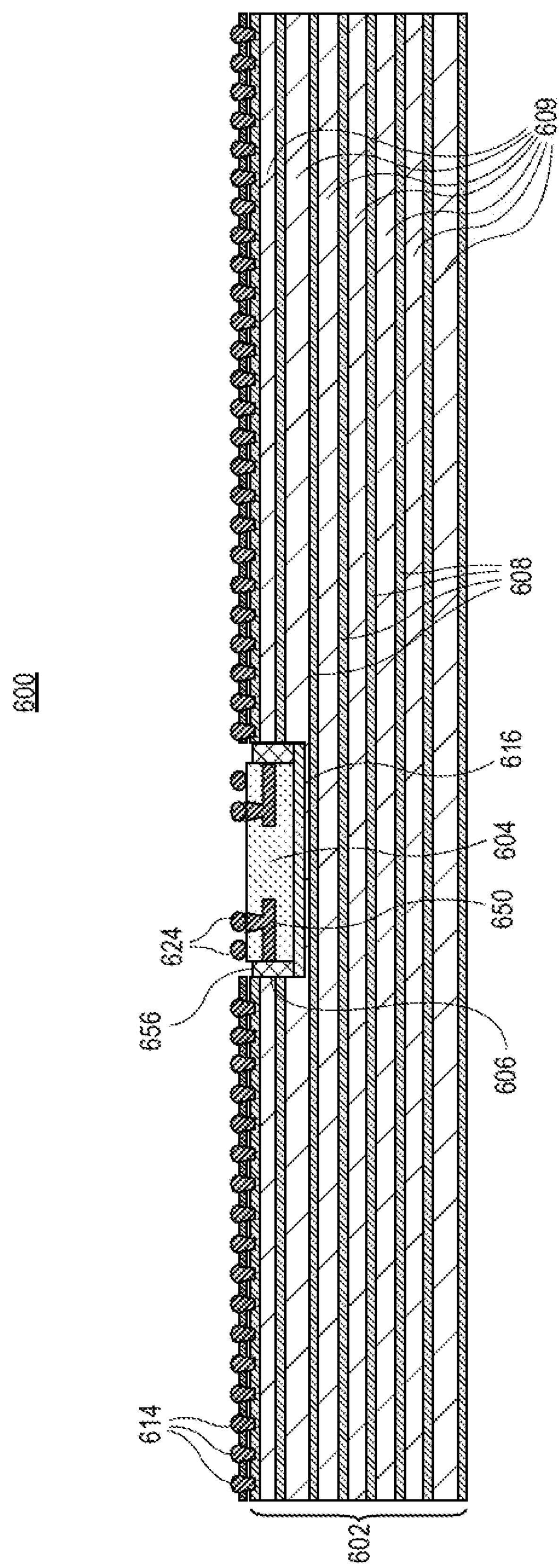
FIG. 6 is a cross-sectional illustration of another electronic package with an open cavity bridge, in accordance with another embodiment of the present disclosure.

Referring to FIG. 6, an electronic apparatus 600 includes a package substrate 602 having alternating metallization layers 608 and dielectric layers 609. The package substrate 602 includes a first plurality of substrate pads and a second plurality of substrate pads, which may be coupled to the metallization layers 608 by conductive vias. An open cavity 606 is between the first plurality of substrate pads and the second plurality of substrate pads. The open cavity 606 has a bottom and sides. A bridge die 604 is in the open cavity 606. The bridge die 604 includes a first plurality of bridge pads, a second plurality of bridge pads, and may further include conductive traces (not depicted). A gap is laterally between the bridge die 604 and the sides of the open cavity 606. The gap surrounds the bridge die 604. One or more of the metallization layers 608 of the package substrate 602 is exposed at one of the sides of the open cavity 606. The bridge die 604 includes an internal trace 650 exposed at a side of the bridge die 604. A conductive adhesive 656 is in the gap. The conductive adhesive 656 electrically couples the one of the metallization layers 608 and the internal trace 650 exposed at the side of the bridge die 604. In one embodiment, the one or more of the metallization layers 608 exposed at one of the sides of the open cavity 606 is a power plane.

In an embodiment, electronic apparatus 600 can further include a first die coupled to the first plurality of substrate pads and the first plurality of bridge pads, and a second die coupled to the second plurality of substrate pads and the second plurality of bridge pads, exemplary arrangements for which are described in greater detail below. The second die may be coupled to the first die by the conductive traces of the bridge die 604. In one embodiment, such a first die is coupled to the first plurality of substrate pads and to the first plurality of bridge pads by a first plurality of solder structures (e.g., left substrate solder structures 614 and left bridge solder structures 624), and the second die is coupled to the second plurality of substrate pads and the second plurality of bridge pads by a second plurality of solder structures (e.g., right substrate solder structures 614 and right bridge solder structures 624). In an embodiment, electronic apparatus 600 can further include a board coupled to a side of the package substrate 602 opposite the first die and the second die, exemplary arrangements for which are described in greater detail below.

In an embodiment, an adhesive layer 616 couples the bridge die 604 to the bottom of the open cavity 606. In an embodiment, adhesive layer 616 is epoxy based and may include fillers such as silica. In an embodiment, adhesive layer 616 is directly on a metallization layer 608, or can be on a dielectric layer 609 of the package substrate 602. In an embodiment, adhesive layer 616 is selected on a case by case (cavity by cavity) basis to have a thickness suitable to provide co-planarity of substrate solder structures 614 and bridge solder structures 624 along a common plane. Adhesive layer 616 may be referred to as a pre-filled underfill (UF) layer.

In another aspect, past solutions have involved placement of a bridge die in an open cavity as is, and absorbing any Z height differences in process optimization. However, such an approach can limit the bump pitch on top (interconnected) dice and the bridge die. Other past solutions have involved co-planar placement with respect to the bump field. However, such an approach may require a variable thickness glue, which is challenging for processing.

Advantages to implementing open cavity architectures as described herein can include the opportunity to maintain processing for a package substrate portion at a wider pitch. Scaling to finer feature can be confined to a silicon bridge die. Additionally, die thickness may not be constrained by a chip gap. It is to be appreciated that an open cavity bridge architecture as described herein may be differentiated from an EMIB in that an open cavity bridge is not necessarily covered in or sealed within a package substrate-like interlayer dielectric (ILD) layer.

In accordance with embodiments of the present disclosure, several co-planar arrangements of open cavity bridge architectures are disclosed herein. In an embodiment, a pre-filled underfill/glue is used to adjust a cavity depth, which can enable ease of attachment of a bridge at a correct Z height. In another embodiment, solder is effectively used as a glue, where the solder can be applied with very accurate volume control by placing microballs or plating. The solder may wet only exposed metal surfaces and, as such, may be less prone to overflow.

FIGS. 7A-7D are cross-sectional illustrations of various electronic packages with an open cavity bridge, in accordance with another embodiment of the present disclosure.

In one aspect, an open cavity is pre-filled to achieve a desired Z height. An incoming cavity depth and BTV are measured and the cavity is filled. The resulting pre-filled cavity includes an UF/adhesive/film having a controlled UF amount and/or correct thickness. In one embodiment, UF dots are dropped into the open cavity with an intended filler size (e.g., use of a solder sphere, polymer spheres, Cu balls, solder paste with pre-defined particle size) for improved control. The approach can minimize complexity, aid with UF overflow issues, and/or aid with conducting heat from a pedestal to the bridge during thermocompression bonding (TCB).

Figure 7A:
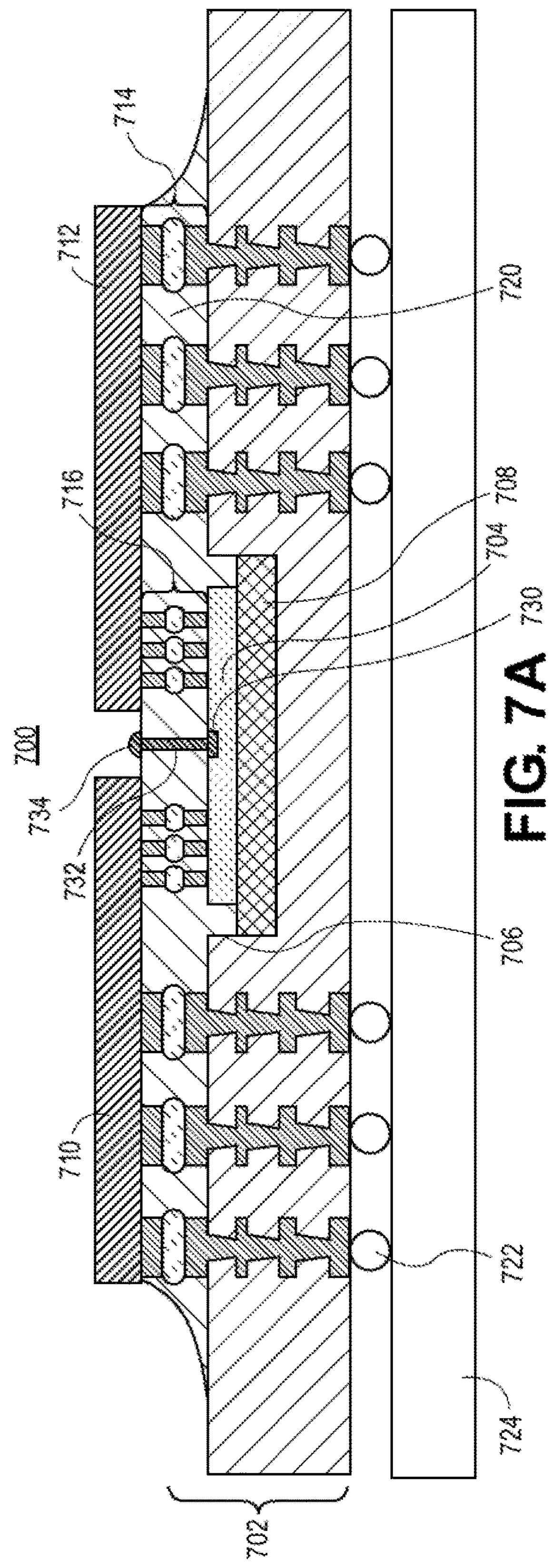
FIGS. 7A-7D are cross-sectional illustrations of various electronic packages with an open cavity bridge, in accordance with another embodiment of the present disclosure.

Referring to FIG. 7A, an electronic apparatus 700 includes a package substrate 702 having alternating metallization layers and dielectric layers. An active bridge die 704 is in an open cavity 706 in the package substrate 702. The open cavity 706 has a bottom and sides. An adhesive layer 708 couples the bridge die 704 to the bottom of the open cavity 706, such as described above in association with FIG. 2. In an embodiment, a gap is laterally between the bridge die 704 and the sides of the open cavity 706. The gap surrounds the bridge die 704. Electronic apparatus 700 further includes a first die 710 coupled by substrate interconnects (left 714*s*) to package substrate 702, and coupled by bridge interconnects (left 716*s*) to bridge die 704. A second die 712 is coupled by substrate interconnects (right 714*s*) to package substrate 702, and is coupled by bridge interconnects (right 716*s*) to bridge die 704. An underfill material 720 is between the first and second dies 710 and 712 and the package substrate 702, and may further be included in the gap surrounding the bridge die 704, as is depicted. Bridge die 704 further includes a power delivery bridge pad 730. A power delivery conductive line 732, possibly including a cap portion 734, is electrically coupled to the delivery bridge pad 730, such as described in association with FIGS. 2 and 3. In an embodiment, electronic apparatus 700 can further include a board 724, such as a printed circuit board, coupled to a side of the package substrate 702 opposite the first die 710 and the second die 712, e.g., by solder balls or bumps 722.

Figure 7B:
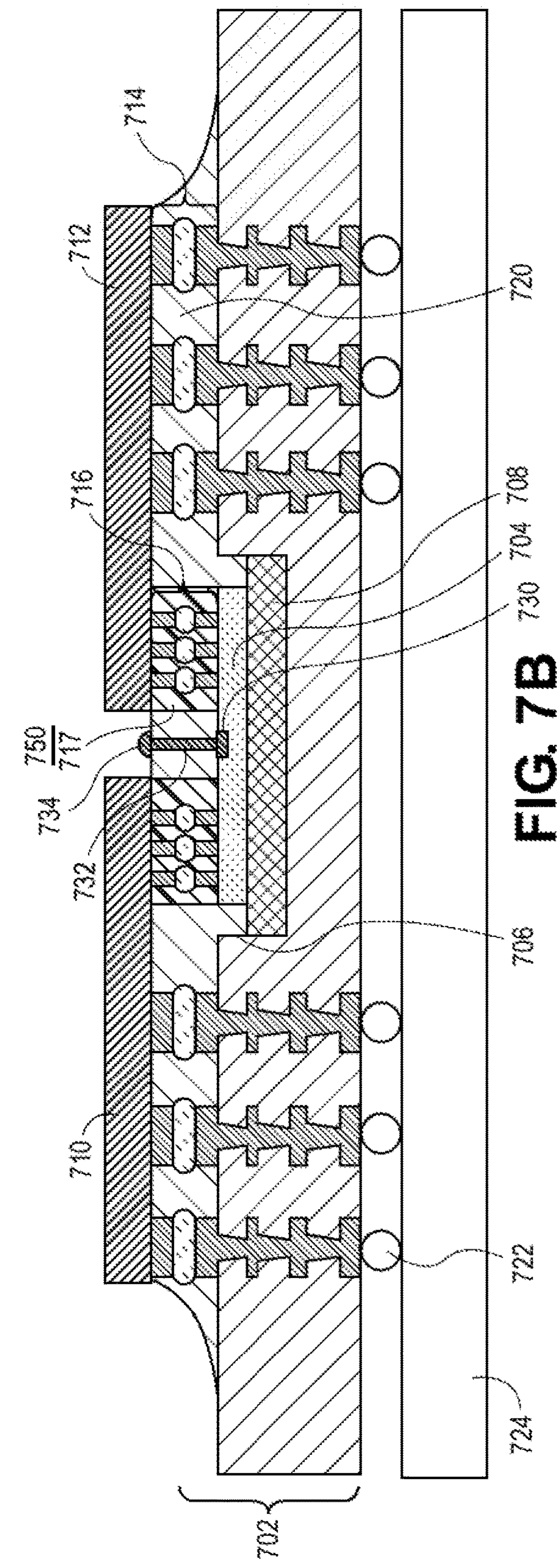

Referring to FIG. 7B, an electronic apparatus 750 includes a package substrate 702 having alternating metallization layers and dielectric layers. An active bridge die 704 is in an open cavity 706 in the package substrate 702. The open cavity 706 has a bottom and sides. An adhesive layer 708 couples the bridge die 704 to the bottom of the open cavity 706, such as described above in association with FIG. 2. In an embodiment, a gap is laterally between the bridge die 704 and the sides of the open cavity 706. The gap surrounds the bridge die 704. Electronic apparatus 750 further includes a first die 710 coupled by substrate interconnects (left 714*s*) to package substrate 702, and coupled by bridge interconnects (left 716*s*) to bridge die 704. A second die 712 is coupled by substrate interconnects (right 714*s*) to package substrate 702, and is coupled by bridge interconnects (right 716*s*) to bridge die 704. The bridge interconnects 716 are included in epoxy-based interconnect package structures 717. An underfill material 720 is between the first and second dies 710 and 712 and the package substrate 702, and may further be included in the gap surrounding the bridge die 704, as is depicted. Bridge die 704 further includes a power delivery bridge pad 730. A power delivery conductive line 732, possibly including a cap portion 734, is electrically coupled to the delivery bridge pad 730, such as described in association with FIGS. 2 and 3. In an embodiment, electronic apparatus 750 can further include a board 724, such as a printed circuit board, coupled to a side of the package substrate 702 opposite the first die 710 and the second die 712, e.g., by solder balls or bumps 722.

Figure 7C:
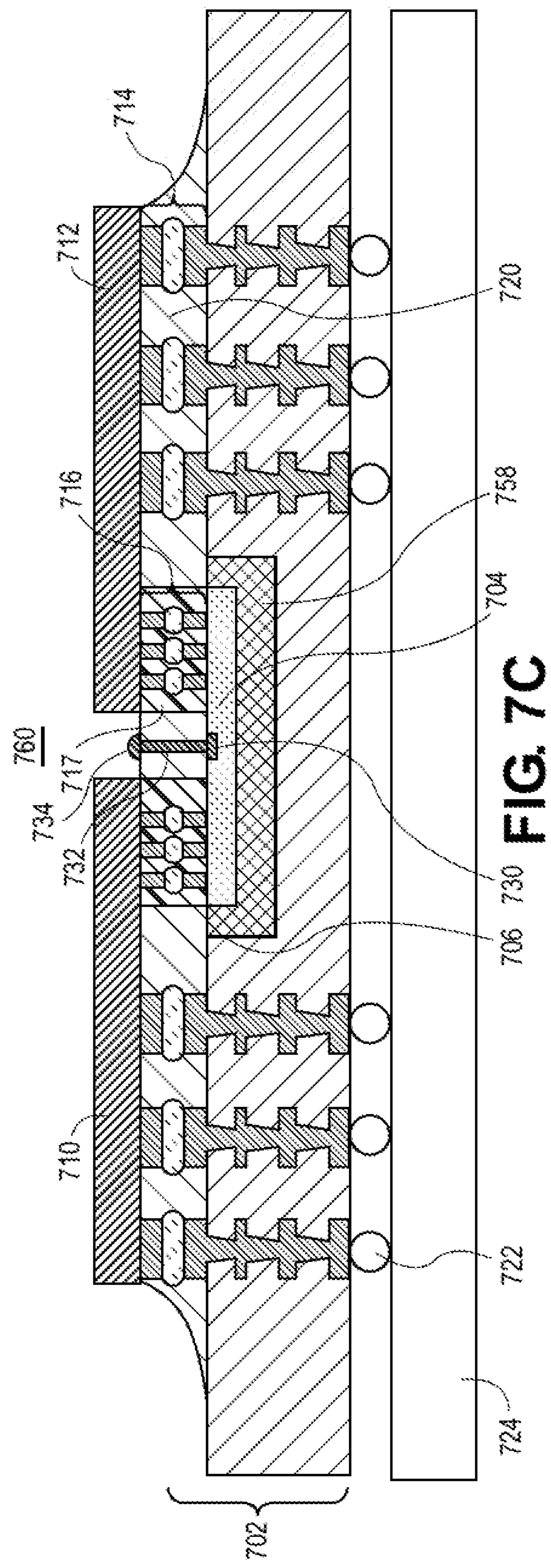

In another example, excess adhesive layer fills the gap between the bridge die and the cavity of the package substrate. Referring to FIG. 7C, an electronic apparatus 760 includes a package substrate 702 having alternating metallization layers and dielectric layers. An active bridge die 704 is in an open cavity 706 in the package substrate 702. The open cavity 706 has a bottom and sides. An adhesive layer

758 couples the bridge die 704 to the bottom of the open cavity 706, and may further be along sidewalls of the bridge die 704 and the sides of the open cavity 706, as is depicted. Electronic apparatus 760 further includes a first die 710 coupled by substrate interconnects (left 714*s*) to package substrate 702, and coupled by bridge interconnects (left 716*s*) to bridge die 704. A second die 712 is coupled by substrate interconnects (right 714*s*) to package substrate 702, and is coupled by bridge interconnects (right 716*s*) to bridge die 704. The bridge interconnects 716 may be included in epoxy-based interconnect package structures 717, as is depicted. An underfill material 720 is between the first and second dies 710 and 712 and the package substrate 702, and may further be included in the gap surrounding the bridge die 704, as is depicted. Bridge die 704 further includes a power delivery bridge pad 730. A power delivery conductive line 732, possibly including a cap portion 734, is electrically coupled to the delivery bridge pad 730, such as described in association with FIGS. 2 and 3. In an embodiment, electronic apparatus 760 can further include a board 724, such as a printed circuit board, coupled to a side of the package substrate 702 opposite the first die 710 and the second die 712, e.g., by solder balls or bumps 722.

In an embodiment, adhesive layer 708 or 758 is epoxy based and may include fillers such as silica. In an embodiment, adhesive layer 708 or 758 is directly on a metallization layer, or can be on a dielectric layer of the package substrate 702. In an embodiment, adhesive layer 708 or 758 is selected on a case by case (cavity by cavity) basis to have a thickness suitable to provide co-planarity of substrate solder structures and bridge solder structures along a plane. Adhesive layer 708 or 758 may be referred to as a pre-filled underfill (UF) layer.

In another aspect, solder is used as an adhesive. Solder may be better controlled in volume. For such cases, a bridge die backside may be metalized, enabling the solder to preferentially wet the die backside instead of squeezing out of the cavity.

Figure 7D:
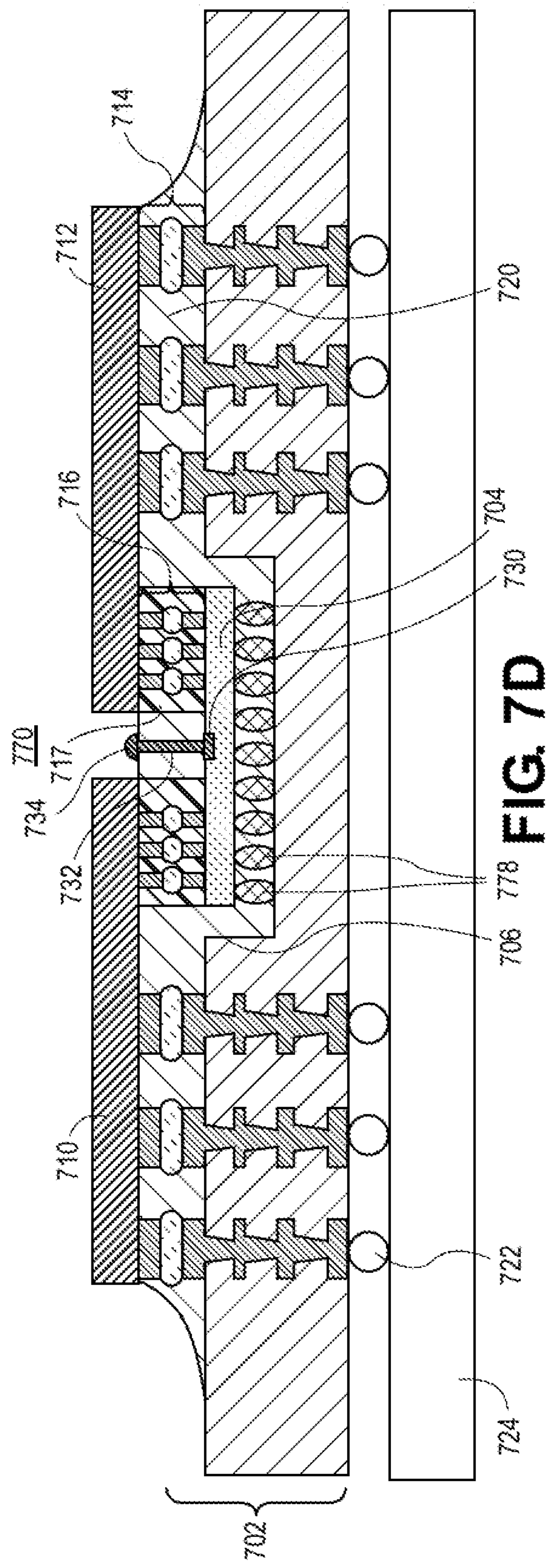

Referring to FIG. 7D, an electronic apparatus 770 includes a package substrate 702 having alternating metallization layers and dielectric layers. An active bridge die 704 is in an open cavity 706 in the package substrate 702. The open cavity 706 has a bottom and sides. A plurality of solder structures 778 couples the bridge die 704 to the bottom of the open cavity 706, such as described above in association with FIG. 3. Electronic apparatus 770 further includes a first die 710 coupled by substrate interconnects (left 714*s*) to package substrate 702, and coupled by bridge interconnects (left 716*s*) to bridge die 704. A second die 712 is coupled by substrate interconnects (right 714*s*) to package substrate 702, and is coupled by bridge interconnects (right 716*s*) to bridge die 704. The bridge interconnects 716 may be included in epoxy-based interconnect package structures 717, as is depicted. An underfill material 720 is between the first and second dies 710 and 712 and the package substrate 702, and may further be included in the gap surrounding the bridge die 704, as is depicted. Bridge die 704 further includes a power delivery bridge pad 730. A power delivery conductive line 732, possibly including a cap portion 734, is electrically coupled to the delivery bridge pad 730, such as described in association with FIGS. 2 and 3. In an embodiment, electronic apparatus 770 can further include a board 724, such as a printed circuit board, coupled to a side of the package substrate 702 opposite the first die 710 and the second die 712, e.g., by solder balls or bumps 722.

It is to be appreciated that a variety of possibilities exist for bridge die arrangements relative to the interconnected dies. As example, FIGS. 8A-8D are plan view illustrations of various electronic packages with an open cavity bridge, in accordance with another embodiment of the present disclosure.

Figure 8A:
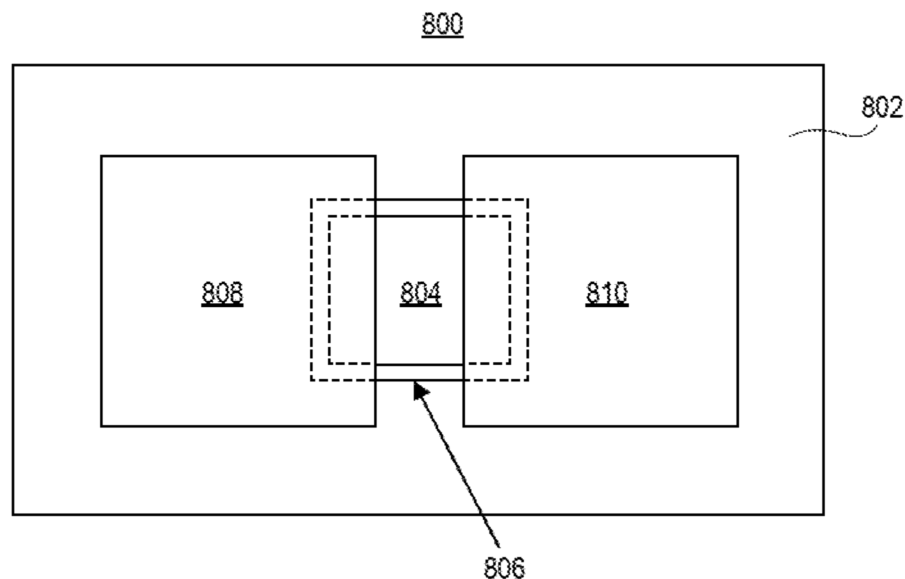
FIGS. 8A-8D are plan view illustrations of various electronic packages with an open cavity bridge, in accordance with another embodiment of the present disclosure.

Referring to FIG. 8A, an electronic package 800 includes a package substrate 802 having an open cavity 806 therein. A bridge die 804 is in the open cavity 806. A first die 808 and a second die 810 are coupled together by the bridge die 804. The first die 808 and the second die 810 have a linear arrangement with respect to the bridge die 804.

Figure 8B:
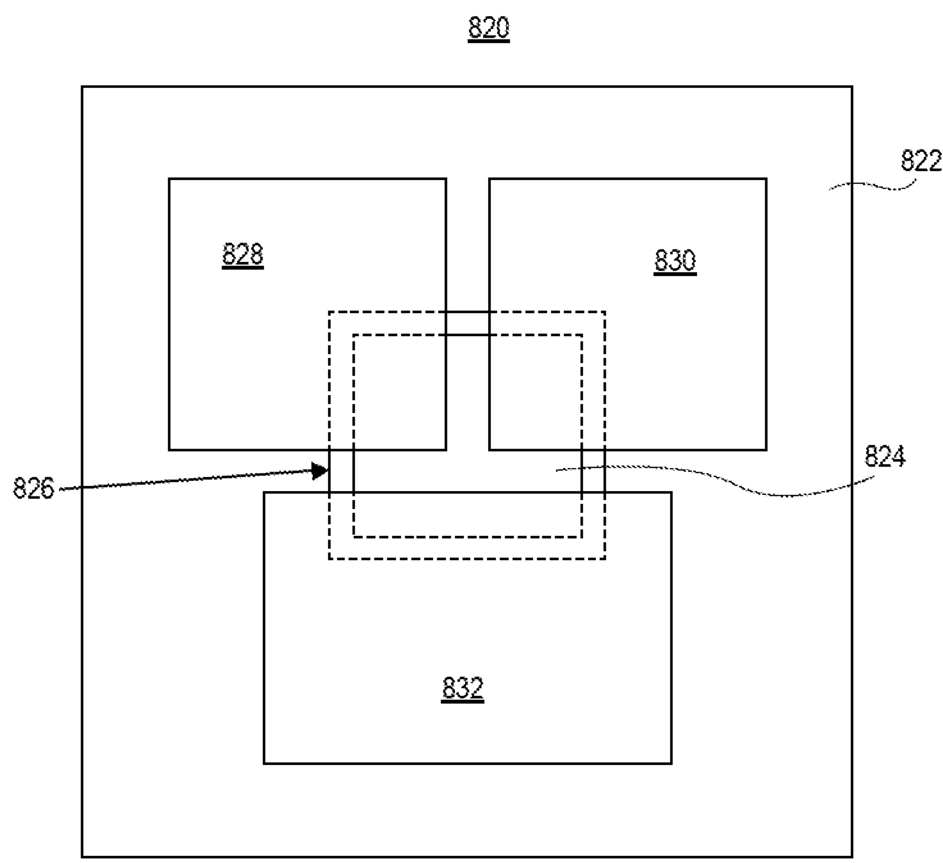

Referring to FIG. 8B, an electronic package 820 includes a package substrate 822 having an open cavity 826 therein. A bridge die 824 is in the open cavity 826. A first die 828, a second die 830, and a third die 832 are coupled together by the bridge die 824.

Figure 8C:
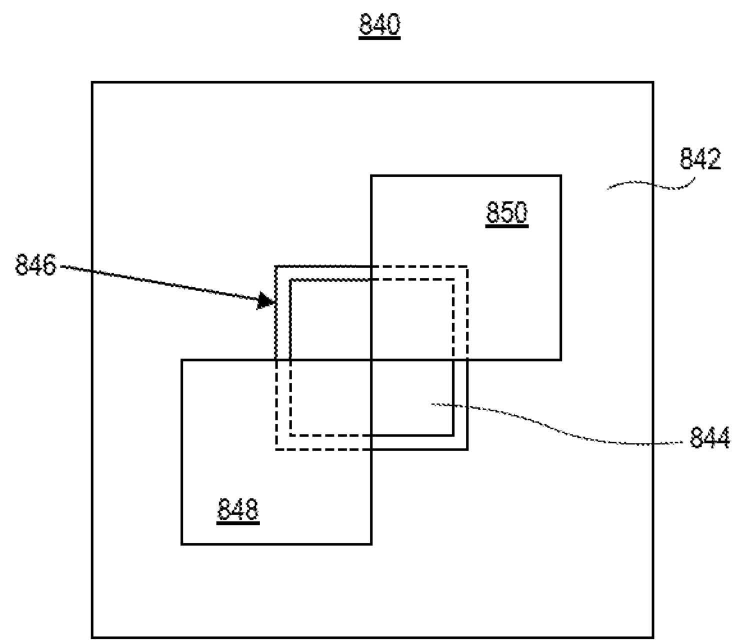

Referring to FIG. 8C, an electronic package 840 includes a package substrate 842 having an open cavity 846 therein. A bridge die 844 is in the open cavity 846. A first die 848 and a second die 850 are coupled together by the bridge die 844. The first die 848 and the second die 850 have a diagonal arrangement with respect to the bridge die 844.

Figure 8D:
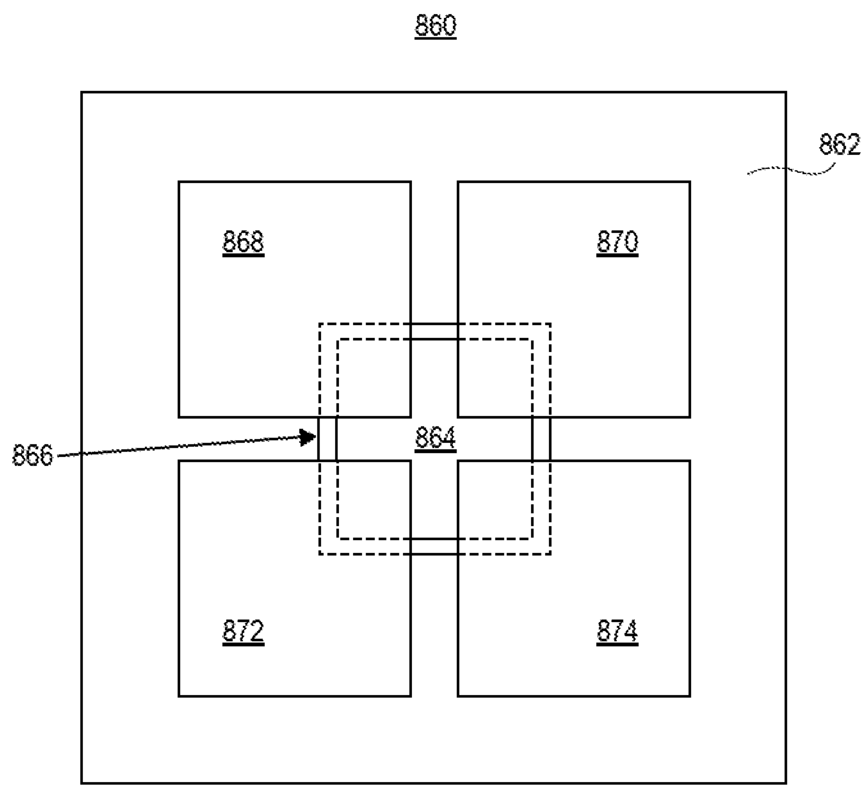

Referring to FIG. 8D, an electronic package 860 includes a package substrate 862 having an open cavity 866 therein. A bridge die 864 is in the open cavity 866. A first die 868, a second die 870, a third die 872, and a fourth die 874 are coupled together by the bridge die 864.

In an embodiment, a bridge die as described herein may include any suitable substrate material. In an embodiment, a bridge die as described herein is a silicon (Si) bridge die. In an embodiment, a bridge die as described herein includes glass, ceramic, semiconductor materials (e.g., high or low resistivity silicon, group III-V semiconductors, or the like), or organic substrates (high density interconnect (HDI) substrates, embedded trace substrates (ETS), high density package (HDP) substrates, molded substrates, or the like). In some embodiments, a bridge die is a passive device. That is, the bridge die may include only passive components (e.g., traces, vias, etc.). In other embodiments, the bridge die may be an active interposer. That is, the bridge die may include active devices (e.g., transistors etc.).

In an embodiment, a bridge die has an active surface. While referred to as an “active” surface, it is to be appreciated that the active surface may include entirely passive features. In an embodiment, the bridge die may include through component vias (TCVs). The TCVs may electrically couple the active surface to pads on the backside of the bridge die. In an embodiment, the bridge die has first level interconnects (FLIs) such as a copper bump, a solder, or any other suitable FLI interconnect architecture.

In an embodiment, a plurality of dies coupled by a bridge die may be any type of dies. For example, the dies may be processor dies, memory dies, graphics dies, or the like. In an embodiment, the dies may be embedded in a mold layer. An underfill layer may also partially embed the dies and surround interconnects below the dies, exemplary structures of which are described above.

Figure 9:
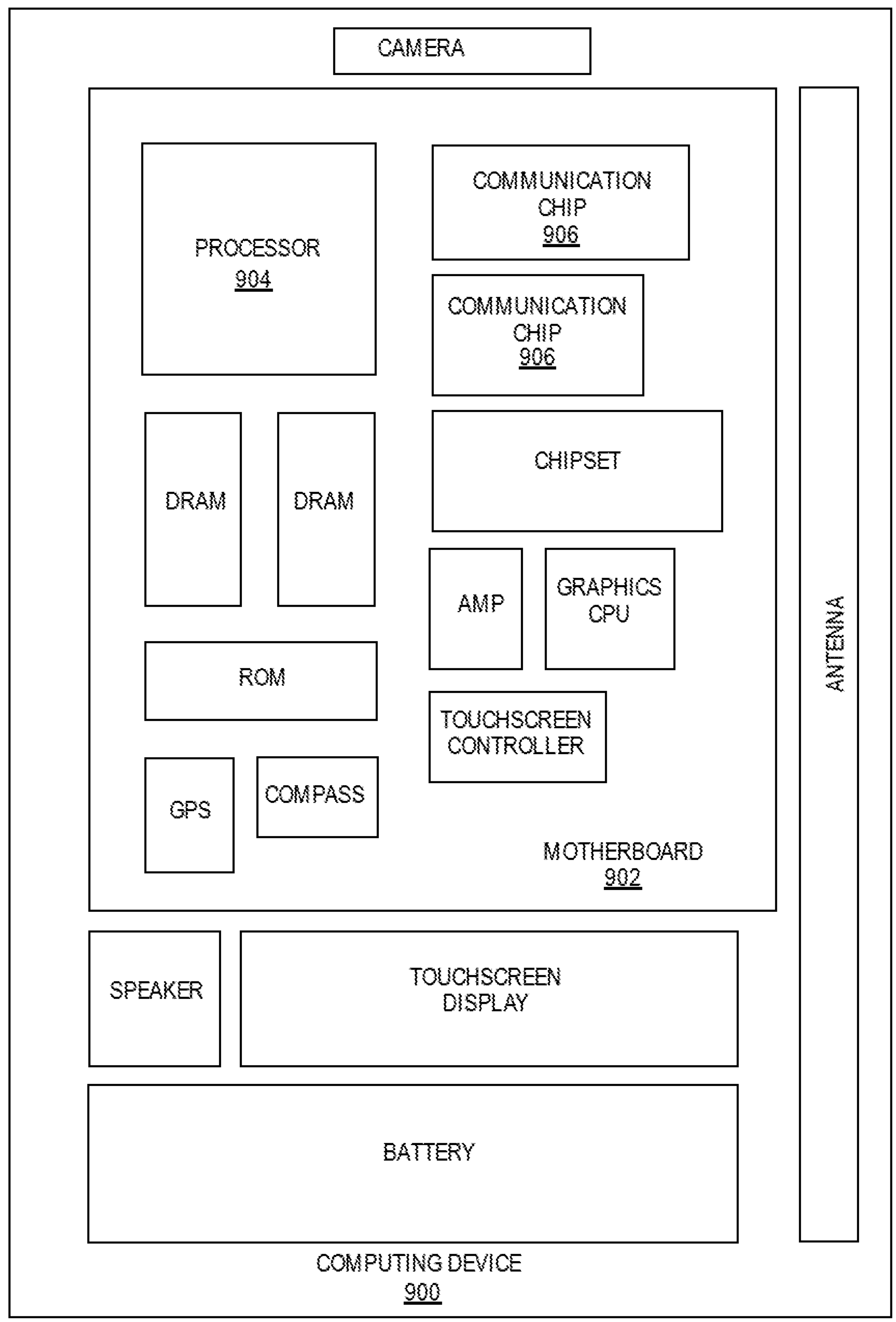
FIG. 9 is a schematic of a computing device built in accordance with an embodiment of the present disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations, the integrated circuit die of the processor 904 may be part of an electronic package that includes an open cavity bridge, in accordance with embodiments described herein. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation, the integrated circuit die of the communication chip 906 may be part of an electronic package that includes an open cavity bridge, in accordance with embodiments described herein.

Thus, multi-die packages with open cavity bridges are described herein.

The above description of illustrated implementations, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An electronic apparatus includes a package substrate having alternating metallization layers and dielectric layers. The package substrate includes a first plurality of substrate pads and a second plurality of substrate pads, and an open cavity between the first plurality of substrate pads and the second plurality of substrate pads, the open cavity having a bottom and sides. A bridge die is in the open cavity, the bridge die including a first plurality of bridge pads, a second plurality of bridge pads, a power delivery bridge pad between the first plurality of bridge pads and the second plurality of bridge pads, and conductive traces. A first die is coupled to the first plurality of substrate pads and the first plurality of bridge pads. A second die is coupled to the second plurality of substrate pads and the second plurality of bridge pads, the second die coupled to the first die by the conductive traces of the bridge die. A power delivery conductive line is coupled to the power delivery bridge pad.

Example embodiment 2: The electronic apparatus of example embodiment 1, further including an underfill material between the first die and the package substrate, between the first die and the bridge die, between the second die and the package substrate, between the second die and the bridge die, and in the open cavity.

Example embodiment 3: The electronic apparatus of example embodiment 2, further including a trench in the underfill material between the first die and the second die, wherein the power delivery conductive line is in the trench.

Example embodiment 4: The electronic apparatus of example embodiment 1, 2 or 3, wherein the package substrate further includes a substrate pad outside of a footprint of the first die and the second die, wherein the power delivery conductive line is coupled to the substrate pad outside of the footprint of the first die and the second die.

Example embodiment 5: The electronic apparatus of example embodiment 1, 2, 3 or 4, further including solder structures coupling the bridge die to the bottom of the open cavity.

Example embodiment 6: The electronic apparatus of example embodiment 5, wherein the bottom of the cavity has an exposed metal layer, wherein the bridge die has a first side including the first plurality of bridge pads, the second plurality of bridge pads, the power delivery bridge pad, and the conductive traces, and the bridge die having a second side including a metallization layer, and wherein the solder structures in contact with the metallization layer of the bridge die and in contact with the exposed metal layer of the bottom of the open cavity.

Example embodiment 7: The electronic apparatus of example embodiment 1, 2, 3 or 4, further including an adhesive layer coupling the bridge die to the bottom of the open cavity.

Example embodiment 8: The electronic apparatus of example embodiment 1, 2, 3, 4, 5, 6 or 7, wherein the first die is coupled to the first plurality of substrate pads and the first plurality of bridge pads by a first plurality of solder structures, and the second die is coupled to the second plurality of substrate pads and the second plurality of bridge pads by a second plurality of solder structures.

Example embodiment 9: The electronic apparatus of example embodiment 1, 2, 3, 4, 5, 6, 7 or 8, further including a board coupled to a side of the package substrate opposite the first die and the second die.

Example embodiment 10: The electronic apparatus of example embodiment 1, 2, 3, 4, 5, 6, 7, 8 or 9, wherein adjacent pads of the first plurality of bridge pads and adjacent pads of the second plurality of bridge pads have a first pitch, and wherein adjacent pads of the first plurality of substrate pads and adjacent pads of the second plurality of substrate pads have a second pitch greater than the first pitch.

Example embodiment 11: The electronic apparatus of example embodiment 10, wherein the first pitch is less than approximately 100 μm and the second pitch is greater than approximately 100 μm.

Example embodiment 12: An electronic apparatus includes a package substrate having alternating metallization layers and dielectric layers. The package substrate includes a first plurality of substrate pads and a second plurality of substrate pads, and an open cavity between the first plurality of substrate pads and the second plurality of substrate pads, the open cavity having a bottom and sides. A bridge die is in the open cavity, the bridge die including a first plurality of bridge pads, a second plurality of bridge pads, a plurality of power delivery bridge pads between the first plurality of bridge pads and the second plurality of bridge pads, and conductive traces. A plurality of bridge solder structures is coupled to corresponding ones of the plurality of power delivery bridge pads. A first die is coupled to the first plurality of substrate pads and the first plurality of bridge pads. A second die is coupled to the second plurality of substrate pads and the second plurality of bridge pads, the second die coupled to the first die by the conductive traces of the bridge die. A power delivery conductive line is coupled to the plurality of solder structures.

Example embodiment 13: The electronic apparatus of example embodiment 12, wherein the package substrate further includes a plurality of substrate pads between the first die and the second die, and a plurality of substrate solder structures coupled to corresponding ones of the plurality of substrate pads, wherein the power delivery conductive line is coupled to the plurality of substrate solder structures.

Example embodiment 14: The electronic apparatus of example embodiment 12 or 13, further including an underfill material between the first die and the package substrate, between the first die and the bridge die, between the second die and the package substrate, between the second die and the bridge die, and in the open cavity.

Example embodiment 15: The electronic apparatus of example embodiment 12, 13 or 14, further including solder structures coupling the bridge die to the bottom of the open cavity.

Example embodiment 16: The electronic apparatus of example embodiment 15, wherein the bottom of the cavity has an exposed metal layer, wherein the bridge die has a first side including the first plurality of bridge pads, the second plurality of bridge pads, the power delivery bridge pad, and the conductive traces, and the bridge die having a second side including a metallization layer, and wherein the solder structures in contact with the metallization layer of the bridge die and in contact with the exposed metal layer of the bottom of the open cavity.

Example embodiment 17: The electronic apparatus of example embodiment 12, 13 or 14, further including an adhesive layer coupling the bridge die to the bottom of the open cavity.

Example embodiment 18: The electronic apparatus of example embodiment 12, 13, 14, 15, 16 or 17, wherein the first die is coupled to the first plurality of substrate pads and the first plurality of bridge pads by a first plurality of solder structures, and the second die is coupled to the second plurality of substrate pads and the second plurality of bridge pads by a second plurality of solder structures.

Example embodiment 19: The electronic apparatus of example embodiment 12, 13, 14, 15, 16, 17 or 18, further including a board coupled to a side of the package substrate opposite the first die and the second die.

Example embodiment 20: The electronic apparatus of example embodiment 12, 13, 14, 15, 16, 17, 18 or 19, wherein adjacent pads of the first plurality of bridge pads and adjacent pads of the second plurality of bridge pads have a first pitch, and wherein adjacent pads of the first plurality of substrate pads and adjacent pads of the second plurality of substrate pads have a second pitch greater than the first pitch.

Example embodiment 21: The electronic apparatus of example embodiment 20, wherein the first pitch is less than approximately 100 μm and the second pitch is greater than approximately 100 μm.

Example embodiment 22: An electronic apparatus includes a package substrate having alternating metallization layers and dielectric layers. The package substrate includes a first plurality of substrate pads and a second plurality of substrate pads, and an open cavity between the first plurality of substrate pads and the second plurality of substrate pads, the open cavity having a bottom and sides, wherein one of the metallization layers of the package substrate is exposed at one of the sides of the open cavity. A bridge die is in the open cavity, the bridge die including a first plurality of bridge pads, a second plurality of bridge pads, and conductive traces, and the bridge die including an internal trace exposed at a side of the bridge die. An adhesive layer couples the bridge die to the bottom of the open cavity. A gap is laterally between the bridge die and the sides of the open cavity, the gap surrounding the bridge die. A conductive adhesive is in the gap, the conductive adhesive electrically coupling the one of the metallization layers and the internal trace exposed at the side of the bridge die.

Example embodiment 23: The electronic apparatus of example embodiment 22, wherein the one of the metallization layers is a power plane.

Example embodiment 24: The electronic apparatus of example embodiment 22 or 23, further including a first die coupled to the first plurality of substrate pads and the first plurality of bridge pads, and a second die coupled to the second plurality of substrate pads and the second plurality of bridge pads, the second die coupled to the first die by the conductive traces of the bridge die.

Example embodiment 25: The electronic apparatus of example embodiment 24, wherein the first die is coupled to the first plurality of substrate pads and the first plurality of bridge pads by a first plurality of solder structures, and the second die is coupled to the second plurality of substrate pads and the second plurality of bridge pads by a second plurality of solder structures.

Example embodiment 26: The electronic apparatus of example embodiment 22, 23, 24 or 25, further including a board coupled to a side of the package substrate opposite the first die and the second die.

Example embodiment 27: The electronic apparatus of example embodiment 22, 23, 24, 25 or 26, wherein adjacent pads of the first plurality of bridge pads and adjacent pads of the second plurality of bridge pads have a first pitch, and wherein adjacent pads of the first plurality of substrate pads and adjacent pads of the second plurality of substrate pads have a second pitch greater than the first pitch.

Example embodiment 28: The electronic apparatus of example embodiment 27, wherein the first pitch is less than approximately 100 μm and the second pitch is greater than approximately 100 μm.

What is claimed is:

1. An electronic apparatus, comprising:

a package substrate having alternating metallization layers and dielectric layers, the package substrate comprising:

a first plurality of substrate pads and a second plurality of substrate pads; and an open cavity between the first plurality of substrate pads and the second plurality of substrate pads, the open cavity having a bottom and sides;

a bridge die in the open cavity, the bridge die comprising a first plurality of bridge pads, a second plurality of bridge pads, a power delivery bridge pad between the first plurality of bridge pads and the second plurality of bridge pads, and conductive traces;

a first die coupled to the first plurality of substrate pads and the first plurality of bridge pads, wherein an entirety of the power delivery bridge pad is outside of a footprint of the first die;

a second die coupled to the second plurality of substrate pads and the second plurality of bridge pads, the second die coupled to the first die by the conductive traces of the bridge die, wherein the entirety of the power delivery bridge pad is outside of a footprint of the second die; and a power delivery conductive line coupled to the power delivery bridge pad.

2. The electronic apparatus of claim 1, further comprising:

an underfill material between the first die and the package substrate, between the first die and the bridge die, between the second die and the package substrate, between the second die and the bridge die, and in the open cavity.

3. The electronic apparatus of claim 2, further comprising:

a trench in the underfill material between the first die and the second die, wherein the power delivery conductive line is in the trench.

4. The electronic apparatus of claim 1, wherein the package substrate further comprises a substrate pad outside of a footprint of the first die and the second die, wherein the power delivery conductive line is coupled to the substrate pad outside of the footprint of the first die and the second die.

5. The electronic apparatus of claim 1, further comprising:

solder structures coupling the bridge die to the bottom of the open cavity.

6. The electronic apparatus of claim 5, wherein the bottom of the cavity has an exposed metal layer, wherein the bridge die has a first side comprising the first plurality of bridge pads, the second plurality of bridge pads, the power delivery bridge pad, and the conductive traces, and the bridge die having a second side comprising a metallization layer, and wherein the solder structures in contact with the metallization layer of the bridge die and in contact with the exposed metal layer of the bottom of the open cavity.

7. The electronic apparatus of claim 1, further comprising:

an adhesive layer coupling the bridge die to the bottom of the open cavity.

8. The electronic apparatus of claim 1, wherein the first die is coupled to the first plurality of substrate pads and the first plurality of bridge pads by a first plurality of solder structures, and the second die is coupled to the second plurality of substrate pads and the second plurality of bridge pads by a second plurality of solder structures.

9. The electronic apparatus of claim 1, further comprising:

a board coupled to a side of the package substrate opposite the first die and the second die.

10. The electronic apparatus of claim 1, wherein adjacent pads of the first plurality of bridge pads and adjacent pads of the second plurality of bridge pads have a first pitch, and wherein adjacent pads of the first plurality of substrate pads and adjacent pads of the second plurality of substrate pads have a second pitch greater than the first pitch.

11. The electronic apparatus of claim 10, wherein the first pitch is less than approximately 100 μm and the second pitch is greater than approximately 100 μm.

* * * * *